(12) United States Patent
Petruzzi et al.

(10) Patent No.: US 7,621,671 B2
(45) Date of Patent: Nov. 24, 2009

(54) METHOD AND APPARATUS FOR THERMAL PROTECTION IN AN INTEGRATED CIRCUIT

(75) Inventors: Luca Petruzzi, Villach (AT); Francesca Romano, Villach (AT); Albino Pidutti, Villach (AT); Alberto Zanardi, Latschach (AT)

(73) Assignee: Infineon Technologies AG, Neubiberg (DE)

( * ) Notice: Subject to any disclaimer, the term of this patent is extended or adjusted under 35 U.S.C. 154(b) by 172 days.

(21) Appl. No.: 11/749,487

(22) Filed: May 16, 2007

(65) Prior Publication Data

US 2008/0285623 A1     Nov. 20, 2008

(51) Int. Cl.
     *G01K 7/00*      (2006.01)
(52) U.S. Cl. ...................................... 374/170; 374/178
(58) Field of Classification Search .................. 374/170, 374/178, 163
See application file for complete search history.

(56) References Cited

U.S. PATENT DOCUMENTS

| 5,357,089 | A | 10/1994 | Prentice | |
| 5,886,515 | A | 3/1999 | Kelly | |
| 6,002,244 | A | 12/1999 | Wrathall | |
| 6,128,172 | A | 10/2000 | Feldtkeller | |
| 6,921,199 | B2 * | 7/2005 | Aota et al. | 374/178 |
| 7,033,072 | B2 * | 4/2006 | Aota et al. | 374/178 |
| 2004/0004992 | A1 * | 1/2004 | Aota et al. | 374/163 |

* cited by examiner

*Primary Examiner*—Andre J Allen
(74) *Attorney, Agent, or Firm*—Schwegman, Lundberg & Woessner, P.A.

(57) ABSTRACT

Some embodiments discussed relate to an apparatus comprising a temperature sensor disposed in an integrated circuit, the temperature sensor including a bipolar transistor having a collector coupled to a portion of a substrate of the integrated circuit, and a bandgap reference circuit configured to generate a reference voltage, and a comparator coupled to the temperature sensor and the bandgap reference circuit, the comparator configured to receive a first voltage from the emitter of the bipolar transistor and the reference voltage from the bandgap reference circuit and generate a switch-off signal based on a voltage difference between the first voltage and the reference voltage.

19 Claims, 3 Drawing Sheets

METHOD AND APPARATUS FOR THERMAL PROTECTION IN AN INTEGRATED CIRCUIT

TECHNICAL FILED

This application related to integrated circuits, for example integrated power circuits.

BACKGROUND

Thermal protection circuits are used in integrated power circuits to switch off circuit components having a high dissipation power when a defined temperature threshold is exceeded. This protects the entire integrated circuit from being destroyed.

BRIEF SUMMARY OF THE INVENTION

Some embodiments discussed relate to an apparatus and method comprising a temperature sensor disposed in an integrated circuit, the temperature sensor including a transistor coupled to a portion of a substrate of the integrated circuit, and a reference circuit configured to generate a reference voltage. The comparator coupled to the temperature sensor and the reference circuit and configured to receive a first voltage from the transistor and the reference voltage from the reference circuit and generate a switch-off signal based on a voltage difference between the first voltage and the reference voltage.

DETAILED DESCRIPTION

Figure 1:
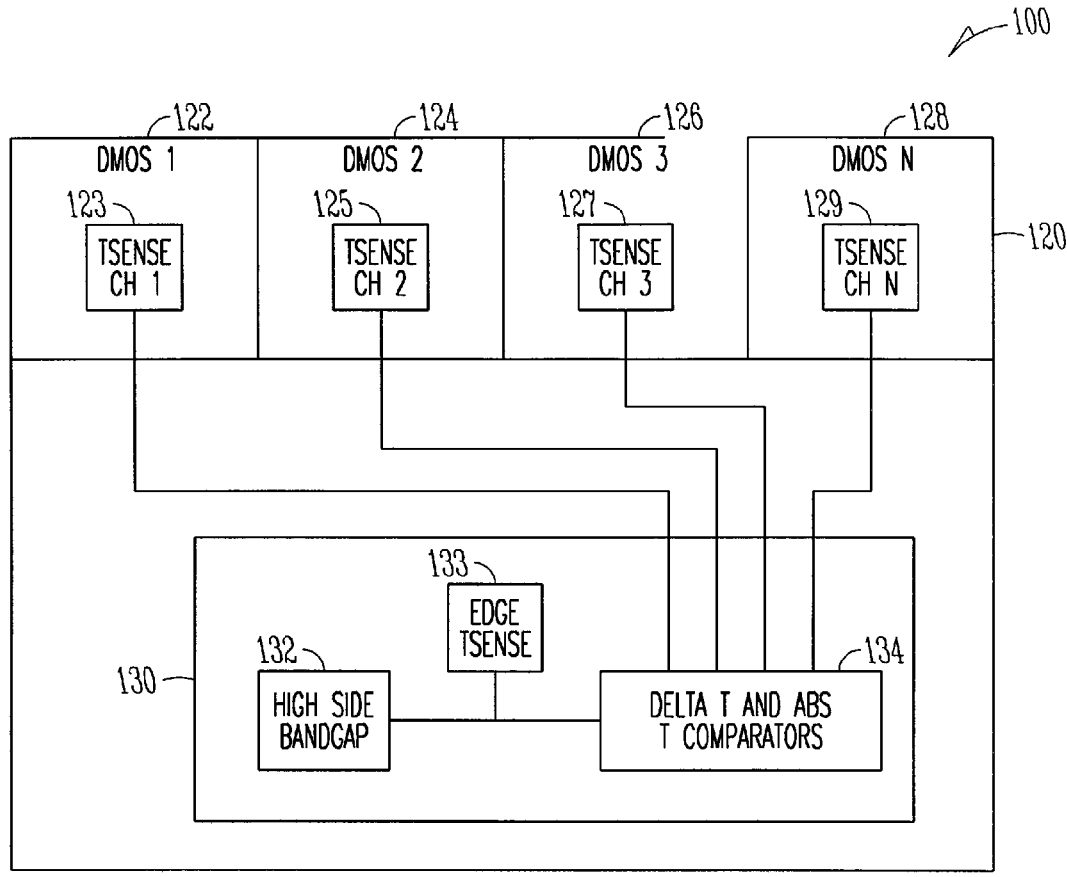
FIG. 1 is a block diagram of a system for thermal sensing and protection in an integrated circuit, according to an example embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

An overload or a short circuit to ground at the output of a high side power device results in rapid increase in temperature in the device which could cause destruction of the device. In some embodiments, temperature sensors are integrated to detect an increase in temperature in the device.

In n-type substrate technologies, an over-temperature condition can be detected by measuring a leakage current rising exponentially at a predefined temperature which is proportional to the collector-emitter leakage current of a bipolar temperature sensing device. This method for the over-temperature condition detection is not convenient from the standpoint of the area occupied by the sensing apparatus on the integrated circuit because the thermal sensor needs to be big enough to have usable value of leakage current. Additionally, by using a large temperature sensor, the temperature difference between the hot spot (test site) in the integrated circuit and the area covered by the thermal sensor can be large enough to cause a delay in the detection of the overheating. Moreover, the use of such a method for sensing the temperature does not allow for the implementation of differential temperature ("Delta T") detection that includes sensing the temperature difference between two points on the integrated circuit. Furthermore, the choice of comparators to minimize the area and current consumption is critical for designs including multi-channel high side power switches.

The use of thermal sensors based on $V_{BE}$ monitoring allows for a smaller design compared to using sensors based on leakage monitoring. Additionally, it provides for better thermal coupling with the hot spot in the integrated circuit. Also, the use of "$V_{BE}$ sensing" compared with the "leakage sensing" allows for implementing differential over-temperature detection. In some embodiments, the use of a bandgap reference voltage ensures a constant Delta-T temperature over an external temperature range varying from −40° C. to 150° C.

According to the embodiments described herein, a temperature sensing apparatus is disclosed wherein the temperature of a test site is determined in a integrated circuit wafer including a high-side switching device. The absolute temperature of the region proximate to the high-side switching device is determined and based on the temperature a switch-off signal is generated that is used to turn-off the high-side switching device thereby protecting the high-side switching device from thermal damage. Additionally disclosed herein is a method and apparatus for detecting a differential temperature between the temperature at an edge of the integrated circuit wafer and a test site proximate to the high-side switch disposed within the integrated circuit wafer. Based on the difference between the temperature at the edge of the integrated circuit wafer and the temperature at the test site, a switch-off signal is generated that is used to turn-off the high-side switching device.

FIG. 1 is a block diagram of a system 100 for thermal sensing and protection of an integrated circuit, according to an example embodiment. System 100 includes an integrated circuit wafer 120 including different regions 122, 124, 126, and 128. Each of the regions 122, 124, 126, and 128 include temperature sensing elements 123, 125, 127, and 129, respectively. In some embodiments, temperature sensing elements 123, 125, 127, and 129 include npn bipolar transistors. In some embodiments, vertical npn bipolar transistors with collector in n-type substrate are used as thermal sensors. In some embodiments, the collectors of npn bipolar transistors 123, 125, 127, and 129 are electrically coupled to an n-type substrate of integrated circuit wafer 120. Such a structure exploits the linear thermal coefficient of its forward-biased base-emitter junction voltage (for e.g., −1.7 mV/° C.). In some embodiments, by using a $V_{BE}$ temperature sensing, the absolute over-temperature inside the integrated circuit can be detected with bandgap precision and differential temperature detection can be easily implemented independent of the environment temperature. The temperature sensing elements 123, 125, 127 and 129 are coupled to a processing unit 130.

In some embodiments, processing unit 130 includes a high side bandgap circuit 132, an edge sensing element 133, and a set of comparators 134. In some embodiments, the high side bandgap circuit 132 provides a reference voltage. In some embodiments, edge sensing element 133 includes an npn bipolar transistor that is used for performing temperature sensing at an edge of the integrated circuit wafer 120.

In some embodiments, edge sensing element 133 includes an edge npn bipolar transistor that is located at an edge of the wafer and configured to determinate the differential temperature between the edge of the integrated circuit 120 and a given test site within the integrated circuit wafer 120. In some embodiments, the edge transistor may be placed within the integrated circuit wafer 120 and away from the test site in the integrated circuit wafer 120.

In some embodiments, the set of comparators 134 includes a first group of comparators used for differential temperature sensing and a second group of comparators used for absolute temperature sensing. FIG. 1 shows the basic scheme for the detection of both absolute and differential over-temperature in case of a multi-channel high side power switch. In some embodiments, integrated circuit 120 includes regions 122, 124, 126, and 128 having DMOS 1, DMOS 2, DMOS 3, and DMOS N respectively. In some embodiments, N+1 thermal sensors are necessary in total, where N sensors placed in the middle of each DMOS placed in regions 122, 124, 126, and 128 and one sensor is placed in the periphery of the chip or integrated circuit.

The structure adopted in system 100 reduces the number of comparators used by sharing of comparators coupled to the thermal sensors for each channel that would otherwise be necessary. Such a structure provides for a more compact design having lower global current consumption.

Figure 2:
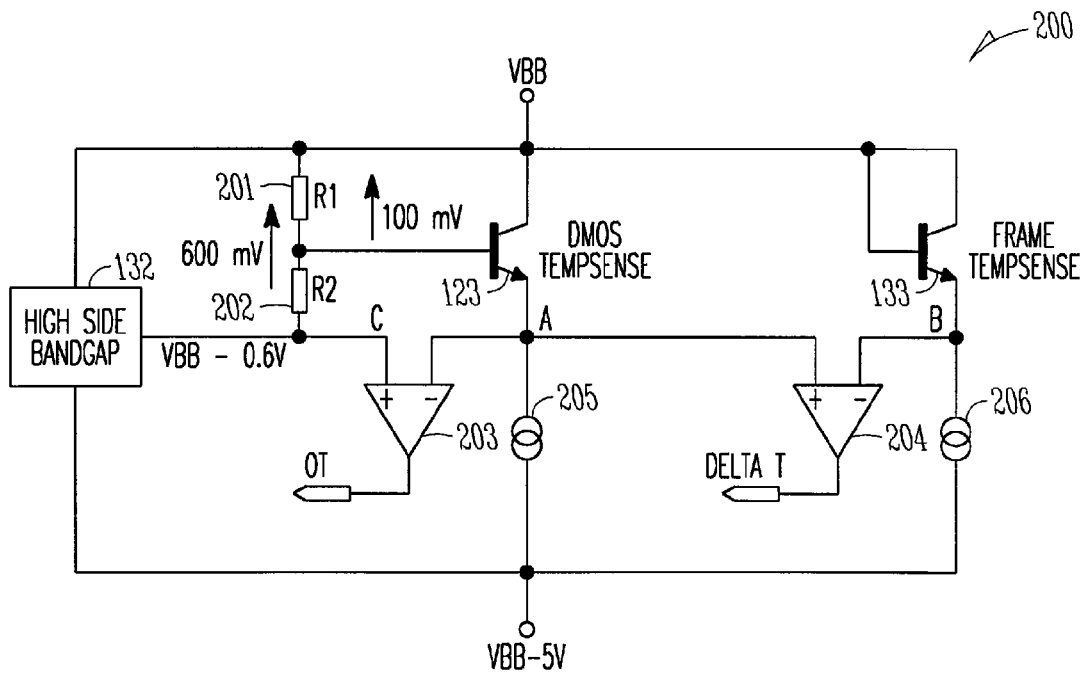
FIG. 2 is a circuit for providing thermal sensing and protection in an integrated circuit, according to an example embodiment.

FIG. 2 is a circuit 200 for providing thermal sensing and protection in an integrated circuit, according to an example embodiment. Circuit 200 includes a temperature sensing element 123, an edge temperature sensing element 133, comparators 203, 204, current sources 205, 206, a high side bandgap circuit 132, and resistors 201, 202. In some embodiments, the high side bandgap circuit 132 is coupled between a voltage $V_{BB}$ and $V_{BB}$-5V. High side bandgap circuit 132 also provides a lead that has a voltage $V_{BB}$-0.6V which is coupled to one end of resistor 202 and an a first input to comparator 203. Additionally, bandgap circuit 132 is coupled to one end of resistor 201 and one end of resistor 202. The remaining ends of resistors 201 and 202 are coupled to the base of temperature sensing element 123 which is a transistor. The collector of transistor 123 is coupled to $V_{BB}$. The emitter of transistor 123 is coupled to a second input of comparator 203, current source 205 and a first input of comparator 204. The base and collector of transistor 133 are coupled to $V_{BB}$ and the emitter of transistor 133 is coupled to a second input of comparator 204 and current source 206. The output of comparator 203 is coupled to an over-temperature (OT) that provides a switch-off signal based on the output signal of comparator 203. The output of comparator 204 is coupled to a differential temperature (Delta-T) that provides a switch-off signal based on the output signal of comparator 204.

Figure 3:
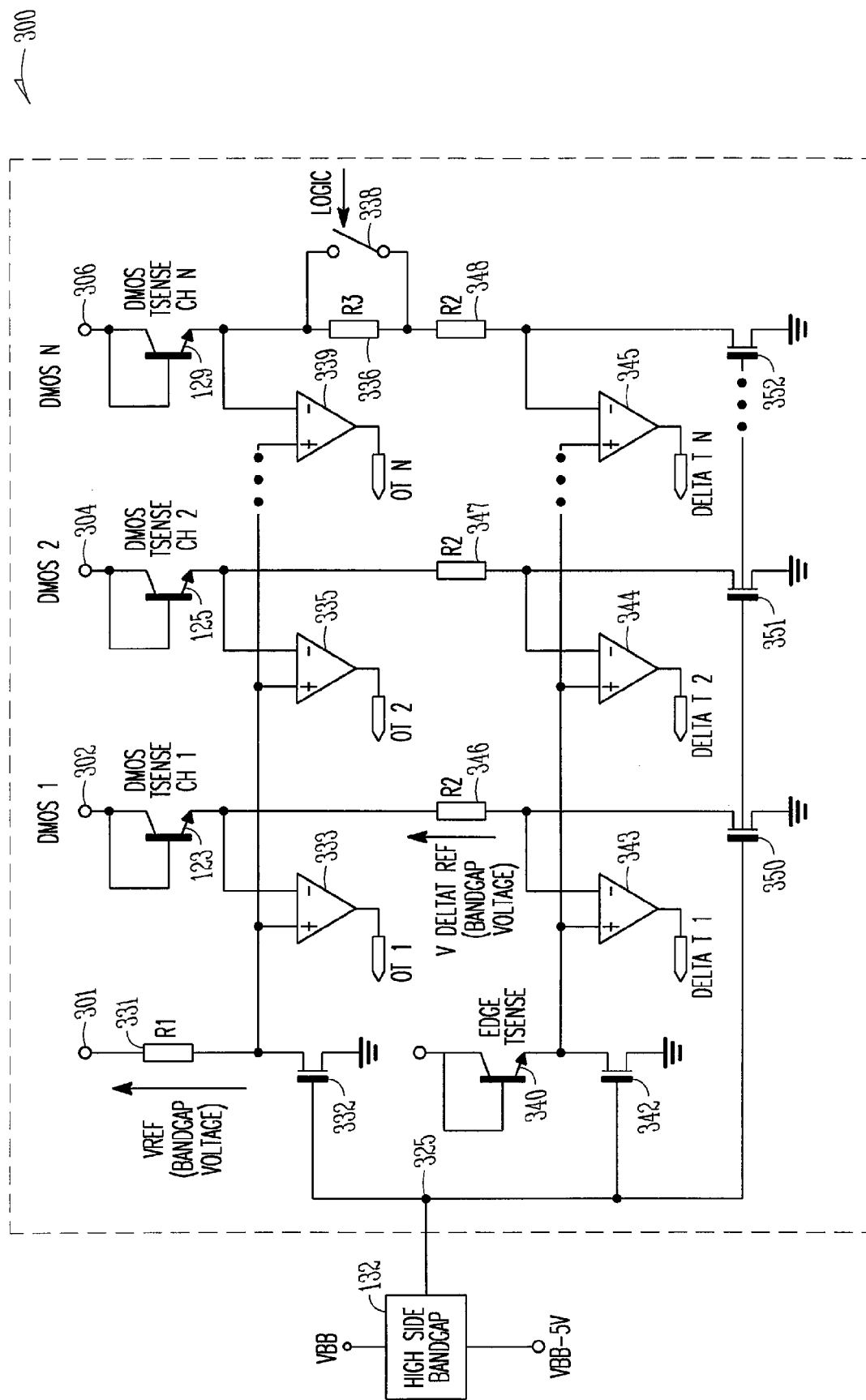
FIG. 3 is a thermal sensing and protection circuit for a multi-channel high side switch system, according to an example embodiment.

FIG. 3 is a thermal sensing and protection circuit 300 for a multi-channel high-side switch system, according to an example embodiment. Circuit 300 includes power source contacts 101, 102, 104, and 108, temperature sense elements 123, 125, and 129 which are bipolar transistors, an edge transistor 340, CMOS switches 332, 342, 350, 351, and 352, comparators 333, 335, 339, 343, 344 and 345, and resistors 331, 336, 346, 347, and 348. In some embodiments the contacts 301, 302, 304, and 306 are electrically coupled to an n-type substrate of an integrated circuit 120 shown in FIG. 1. In some embodiments, the temperature sense elements 123, 125, 129 and edge transistor 340 are bipolar npn transistors. The high-side bandgap circuit 132 is coupled between $V_{BB}$ and $V_{BB}$-5V. Additionally, a bandgap voltage of $V_{BB}$-0.6V is generated across resistor 331. In some embodiments, switches 332, and 342 are located within the high-side bandgap circuit 132. In some embodiments, the emitters of temperature sense elements 123, 125, and 129 are coupled to a first input of comparators 333, 335, and 339, respectively and one end of resistors 346, 347, and 336. In some embodiments, a switch 338 is coupled across resistor 336. In some embodiments, one end of resistor 331 is coupled to contact 101. In some embodiments, the remaining end of resistor 331 is coupled to the second input of comparators 333, 335, and 339, respectively. FIG. 3 illustrates a circuit capable of determining absolute temperature at a particular location in an integrated circuit wafer and is configured to perform a differential temperature detection between two locations within the integrated circuit wafer.

In some embodiments, by implementing an offset voltage and by using the bandgap circuit, the differential temperatures detected can be easily adjusted by providing logic signals at switch 338 and by trimming the resistors in series with the emitter of the thermal sensor in the DMOS (see R3 resistor in FIG. 3). In some embodiments switch 338 is used to select between absolute temperature detection and differential temperature detection.

In some embodiments, each sensor is biased with a current corresponding to a voltage $V_{BE}$ approximately equal to 740 mV at 25° C. In some embodiments, a bandgap reference voltage related to the substrate is also provided. In some embodiments, in order to detect the absolute over-temperature (at 175° C.), the $V_{BE\_TS\_DMOS}$ of the thermal sensor in the DMOS is compared with a constant reference voltage $V_{REF}$ (see FIG. 3) chosen according to the following equation:

$$V_{REF}=V_{BE\_TS\_DMOS}(\text{at } 25°\text{ C.})-1.7\text{ mV/}°\text{ C.}*150°\text{ C.}$$

According to the above equation, when the temperature rises, $V_{BE}$ decreases and as soon as the temperature in the DMOS reaches 175° C. and when $V_{BE\_TS\_DMOS}=V_{REF}$, the comparator provides a signal at OT 1 that causes the DMOS to switch off.

On the other hand, in order to detect the differential over-temperature the $V_{BE\_TS\_DMOS}$ of the thermal sensor in DMOS is compared with $V_{BE\_TS\_EDGE}$ of the thermal sensor at the edge of the device wafer.

In some embodiments, a constant offset "$V_{deltaTref}$" is placed in series with the emitter of the thermal sensor in DMOS in such a way that a switch-off signal is activated when $V_{BE\_TS\_EDGE}=V_{BE\_TS\_DMOS}+V_{deltaTref}$ which corresponds to a temperature difference of $(V_{deltaTref})/(-1.7\text{ mV/}°\text{ C.})$ between the two sensors. In some embodiments, a temperature difference of 60° C. corresponds 100 mV.

In some embodiments, a thermal sensor with the most appropriate thermal characteristics to detect the absolute over-temperature (e.g. 175° C.) during a short circuit event is used. In some embodiments, a reference voltage (bandgap) that ensures a good accuracy in the overheating detection is used. In some embodiments, a Delta-T value (e.g. 60° C.) stable over the whole operating temperature range (-40° C. to 150° C.) exploiting the bandgap voltage is used. In some embodiments, comparators that allow for a compact design in case of multi-channel device is used.

In some embodiments, thermal protection is provided in situations where high side power switches are normally used to drive resistive loads such as lamps because the load can be accidentally short-circuited causing a rapid temperature rise in the chip. In some embodiments, absolute over-temperature detection is combined with Delta-T detection to enhance the robustness of the device in such an event. In some embodiments, the system mentioned herein is used to preventing short circuit in a switch by measuring the temperature in the silicon and turning off the switch if the temperature exceeds about 170° C.

In some embodiments, differential temperature protection is provided by measuring a temperature difference between different points in the silicon and turning off the switch if the temperature difference exceeds higher than 60° C.

Figure 4:
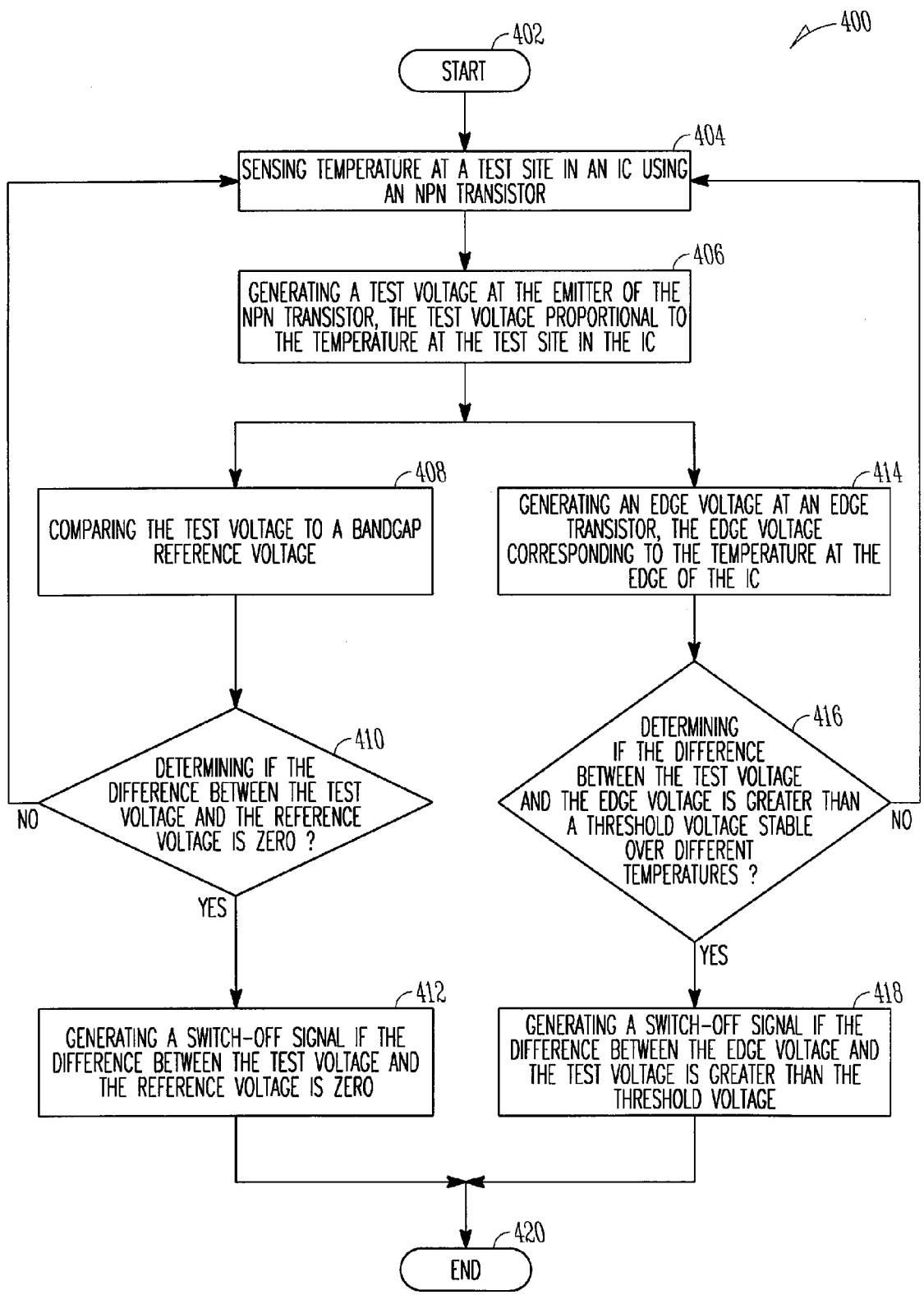
FIG. 4 illustrates a flow chart describing a method for thermal sensing and protection of an integrated circuit, according to an example embodiment.

FIG. 4 illustrates a flow chart describing a method 400 for thermal sensing and protection of an integrated circuit, according to an example embodiment. Method 400 starts at block 402 and proceeds to block 404.

At 404, method 400 includes sensing temperature at a test site in an integrated circuit using a temperature sensor including an npn transistor and proceeds to block 406. At 406, method 400 includes generating a voltage $V_T$ at the emitter of the npn transistor. The generated voltage $V_T$ is proportional to the temperature at the test site in the integrated circuit and proceeds to either of block 408 or 414. In some embodiments, method 400 proceeds to both block 408 and block 414. In some embodiments, blocks 408, 410, and 412 provide for sensing and protecting the integrated circuit for an increase in absolute temperature. In some embodiments, blocks 414, 416, and 418 provide for sensing and protecting the integrated circuit for an increase in differential temperature.

At 408, method 400 includes comparing the voltage $V_T$ to a bandgap reference voltage $V_{REF}$. At 410, method 400 includes determining if the voltage difference between $V_T$ and $V_{REF}$ is zero. If the voltage difference between $V_T$ and $V_{REF}$ is zero, method 400 proceeds to block 412. If the voltage difference between $V_T$ and $V_{REF}$ is not zero, method 400 proceeds to block 404.

At block 412, method 400 includes generating a switch-off signal when the difference between $V_T$ and $V_{REF}$ is zero. The method proceeds to end at block 420.

At block 414, method 400 includes generating an voltage $V_{EDGE}$ at an edge transistor. In some embodiments, $V_{EDGE}$ corresponds to the temperature at an edge of the integrated circuit. In some embodiments, $V_{EDGE}$ corresponds to the temperature at another location in the integrated circuit compared to the test site. Following block 414, the method proceeds to block 416.

At 416, method 400 includes determining if the difference between the test voltage and the edge voltage is greater than a threshold voltage stable over different temperatures.

At block 418, method 400 includes generating a switch-off signal if the difference between the edge voltage and the test voltage is greater than the threshold voltage. The method proceeds to end at block 420.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ".

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
    a temperature sensor disposed in an integrated circuit, the temperature sensor including a bipolar transistor having a collector coupled to a portion of a substrate of the integrated circuit wafer;
    a bandgap reference circuit configured to generate a reference voltage; and
    a comparator coupled to the temperature sensor and the bandgap reference circuit, the comparator configured to receive a first voltage from the emitter of the bipolar transistor and the reference voltage from the bandgap reference circuit and generate a switch-off signal when the voltage difference between the first voltage and the reference voltage is about zero.

2. The apparatus of claim 1, wherein the temperature sensor is configured to measure the absolute temperature of a switch disposed within the integrated circuit wafer.

3. The apparatus of claim 1, wherein the substrate of the integrated circuit wafer includes an n-type material.

4. The apparatus of claim 1, wherein the bipolar transistor includes an npn transistor.

5. The apparatus of claim 1, wherein the switch-off signal turns-off an insulated gate bipolar transistor.

6. The apparatus of claim 1, wherein the switch-off signal turns-off a high side power switch disposed in the integrated circuit wafer.

7. The apparatus of claim 1, wherein the integrated circuit wafer includes a DMOS multi-channel high-side switch.

8. The apparatus of claim 1, further comprising a second temperature sensor disposed on an edge of the integrated circuit wafer, the second temperature sensor coupled to a second comparator and the band gap reference circuit.

9. The apparatus of claim 2, wherein the second comparator is configured to calculate the difference in temperature between the edge of the integrated circuit wafer and the switch disposed within the integrated circuit, based on the voltages generated by each of the first temperature sensor and the second temperature sensor.

10. A method, comprising:
sensing a temperature at a test site in an integrated circuit wafer using an npn transistor, the collector of the npn transistor coupled to an n-type substrate of the integrated circuit wafer;
generating a test voltage at the emitter of the npn transistor, the test voltage proportional to a temperature at the test portion of the integrated circuit wafer;
comparing the test voltage to a reference voltage using a voltage comparator and determining if the difference between the test voltage and reference voltage is greater than a threshold voltage; and
generating a switch-off signal when the difference between the test voltage and the reference voltage is about zero.

11. The method of claim 10, further comprising turning off a switch disposed in the integrated circuit wafer using the switch-off signal.

12. The method of claim 10, wherein terminating power to the switch disposed in the integrated circuit wafer includes terminating power to a high speed power switch disposed in the integrated circuit wafer.

13. The method of claim 10, further comprising generating an edge voltage at the emitter of an edge transistor, the edge voltage corresponding to the temperature at an edge of the integrated circuit wafer.

14. The method of claim 13, further comprising comparing the edge voltage to the test voltage and terminating power to a high speed power switch based on the comparison of the edge voltage and test voltage.

15. The method of claim 10, further comprising generating the reference voltage using a bandgap reference circuit.

16. A system comprising:
a first temperature sensor disposed at a test site in an integrated circuit wafer and configured to generate a first voltage based on a temperature at the test site, the first temperature sensor including a first npn transistor having a collector coupled to an n-type substrate of the integrated circuit wafer;
a bandgap reference circuit configured to generate a reference voltage;
a voltage comparator configured to compare the first voltage to the reference voltage, the first voltage comparator configured to generate a first switch-off signal if the difference between the first test voltage and the reference voltage is about zero.

17. The system of claim 16, wherein the first switch-off signal turns-off a switch disposed in the integrated circuit wafer.

18. The system of claim 17, wherein the reference voltage is generated by a band gap reference circuit.

19. The system of claim 18, further comprising
a second temperature sensor disposed proximate to an edge of the integrated circuit wafer, the second temperature sensor including a second npn transistor configured to generate a second voltage based on a temperature at the edge of the integrated circuit wafer; and
wherein the voltage comparator configured to compare the second voltage to the first voltage and configured to generate a second switch-off signal adapted to turn-off the switch disposed in the integrated circuit wafer if the difference between the second test voltage and the first test voltage is greater than a threshold voltage.

* * * * *

UNITED STATES PATENT AND TRADEMARK OFFICE
CERTIFICATE OF CORRECTION

PATENT NO. : 7,621,671 B2  Page 1 of 1
APPLICATION NO. : 11/749487
DATED : November 24, 2009
INVENTOR(S) : Luca Petruzzi et al.

It is certified that error appears in the above-identified patent and that said Letters Patent is hereby corrected as shown below:

In column 3, line 39, after "and" delete "an".

Signed and Sealed this

Fourth Day of May, 2010

David J. Kappos
*Director of the United States Patent and Trademark Office*